(12) United States Patent
Oliaei et al.

(10) Patent No.: US 7,956,781 B2
(45) Date of Patent: Jun. 7, 2011

(54) ANALOGUE-TO-DIGITAL CONVERTER APPARATUS AND METHOD OF REUSING AN ANALOGUE-TO-DIGITAL CONVERTER CIRCUIT

(75) Inventors: Omid Oliaei, Tempe, AZ (US); Alan Bannon, Tivoli (IE); Anthony Dunne, Carrigaline (IE); Matthew R. Miller, Arlington Heights, IL (US); Daniel O'Hare, Cork (IE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/445,029

(22) PCT Filed: Oct. 13, 2006

(86) PCT No.: PCT/EP2006/067398
§ 371 (c)(1),
(2), (4) Date: Apr. 9, 2009

(87) PCT Pub. No.: WO2008/043397
PCT Pub. Date: Apr. 17, 2008

(65) Prior Publication Data
US 2010/0019944 A1    Jan. 28, 2010

(51) Int. Cl.
*H03M 3/00* (2006.01)
(52) U.S. Cl. ........................... 341/143; 455/338
(58) Field of Classification Search .......... 341/130–155; 455/38, 307, 339, 340, 333; 330/288, 107, 330/306, 257, 259; 363/26, 41; 703/690; 713/401

See application file for complete search history.

(56) References Cited

U.S. PATENT DOCUMENTS

| | | | |
|---|---|---|---|
| 7,031,690 B2* | 4/2006 | Prodanov et al. | 455/338 |
| 7,062,340 B2* | 6/2006 | Melanson | 700/94 |
| 7,116,254 B1 | 10/2006 | Nagai et al. | |
| 2004/0036640 A1 | 2/2004 | Kawamura | |
| 2006/0119491 A1 | 6/2006 | Gealow et al. | |

FOREIGN PATENT DOCUMENTS
EP 0954107 B1 11/1999

OTHER PUBLICATIONS

Jantzi, S.A., et al. "Quadrature Bandpass ΔΣ Modulation for Digital Radio", IEEE Journal of Solid-State Circuits, Dec. 1997, pp. 1935-1950, vol. 32, No. 12.
Coppejans, P., et al., "Continuous time quadrature band-pass ΔΣ modulator with input mixers", RF Circuits and Systems for Wireless Communications, IEE Proc.—Circuits Devices Syst., pp. 331-336, vol. 149, No. 516, Oct./Dec. 2002.
International Search Report and Written Opinion, PCT/EP2006/067396, dated Jun. 21, 2007.

* cited by examiner

*Primary Examiner* — Lam T Mai

(57) ABSTRACT

An analogue-to-digital converter apparatus comprises a first integrator coupled to a second integrator. The first and second integrators are coupled so as to provide a complex pole. The first integrator is selectively electrically decoupleable from the second integrator, thereby removing the complex pole.

20 Claims, 4 Drawing Sheets

US 7,956,781 B2

ANALOGUE-TO-DIGITAL CONVERTER APPARATUS AND METHOD OF REUSING AN ANALOGUE-TO-DIGITAL CONVERTER CIRCUIT

FIELD OF THE INVENTION

This invention relates to an analogue-to-digital converter apparatus of the type that, for example, comprises a first integrator coupled to a second integrator so as to provide a complex pole. This invention also relates to a method of using an analogue-to-digital converter circuit of the type that, for example, comprises a first integrator coupled to a second integrator so as to provide a complex pole.

BACKGROUND OF THE INVENTION

In the field of Radio Frequency (RF) communications, it is known for a communications device, for example a cellular communications handset to comprise a transceiver circuit, the transceiver circuit comprising a receiver circuit, for example a Very Low Intermediate-Frequency (VLIF) receiver. Typically, such receiver circuits are arranged to receive an RF signal and process, separately, an in-phase (I) component and a quadrature (Q) component of the RF signal. The in-phase component is mixed with a real component of an oscillating signal ($Cos(\omega_{Lo}t)$), the resultant signal being subjected to an anti-aliasing filter before being provided to a real Analogue-to-Digital Converter (ADC) followed by digital filtering. Similarly, the quadrature component of the RF signal is mixed with a complex component of the oscillating signal ($-Sin(\omega_{Lo}t)$), the resultant signal being subjected to another anti-alias filter before being provided to another real ADC and then subjected to digital filtering. The result of mixing the in-phase and quadrature components of the RF signal with the respective real and imaginary components of the oscillating signal is effectively to scale the RF signal by an exponential complex function resulting in the frequency of the RF signal being "down converted" to a so-called intermediate frequency.

In order to attenuate quantization noise, the design of the ADCs is such that a Noise Transfer Function (NTF) associated with the ADCs has at least one "zero" (point of high attenuation) at predetermined frequencies from 0 Hz (DC) to 200 kHz, for example at 180 kHz. However, due to a symmetric frequency response about DC of two real ADCs, zeros at respective corresponding negative frequencies also exists. The provision of zeros at both negative and positive frequencies through use of the real ADCs results in unnecessary power consumption, since only positive frequency RF signals need to be processed in the VLIF receiver. In order to avoid the provision of zeros in a negative frequency range, and hence reduce power consumption, a so-called complex ADC is employed, the NTF of the complex ADC only having zeros in the positive frequency range. Complex ADCs typically comprise a first real integrator, coupled to a second real integrator so as to provide a complex pole. However, where other ADC functionality is required in a transceiver integrated circuit, separate ADCs comprising integrators need to be separately provided. The provision of separate ADCs with their separate integrators has a die area cost associated therewith.

STATEMENT OF INVENTION

According to the present invention, there is provided an analogue-to-digital converter apparatus and a method of reusing an analogue-to-digital converter circuit as set forth in the appended claims.

BRIEF DESCRIPTION OF THE DRAWINGS

At least one embodiment of the invention will now be described, by way of example only, with reference to the accompanying drawings, in which.

DESCRIPTION OF PREFERRED EMBODIMENTS

Figure 1:
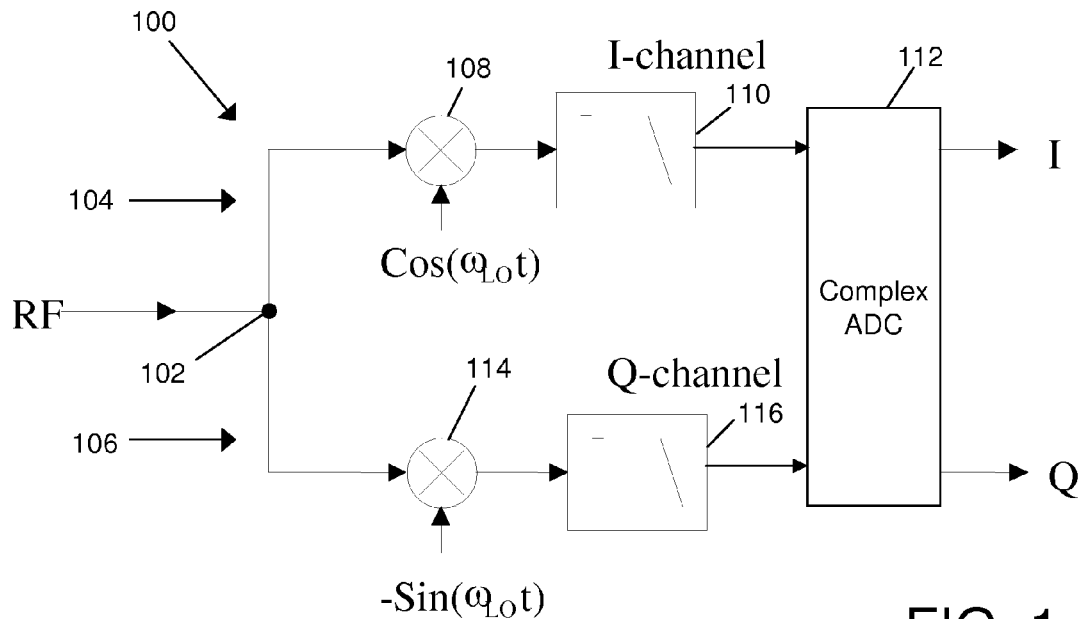
FIG. 1 is a block diagram of a receiver chain of a transceiver.

Throughout the following description identical reference numerals will be used to identify like parts.

Referring to FIG. 1, a receiver chain 100 of a transceiver circuit (not shown) of a wireless communications device, for example a cellular telecommunications handset, comprises an input 102 for receiving an RF signal. The input 102 is coupled to a first, in-phase, receiver path 104 and a second, quadrature, receiver path 106.

The in-phase receiver path 104 comprises a first mixer 108 coupled to a first anti-aliasing filter 110, the first anti-aliasing filter 110 being coupled to a complex Analogue-to-Digital Converter (ADC) circuit 112. The quadrature path comprises a second mixer 114 coupled to a second anti-aliasing filter 116, the second anti-aliasing filter 116 also being coupled to the complex ADC circuit 112.

Although not shown, the skilled person will appreciate that the receiver chain 100 is preceded by functional elements, for example an antenna and a duplexer, and followed by other functional elements, for example digital filters.

Figure 2:
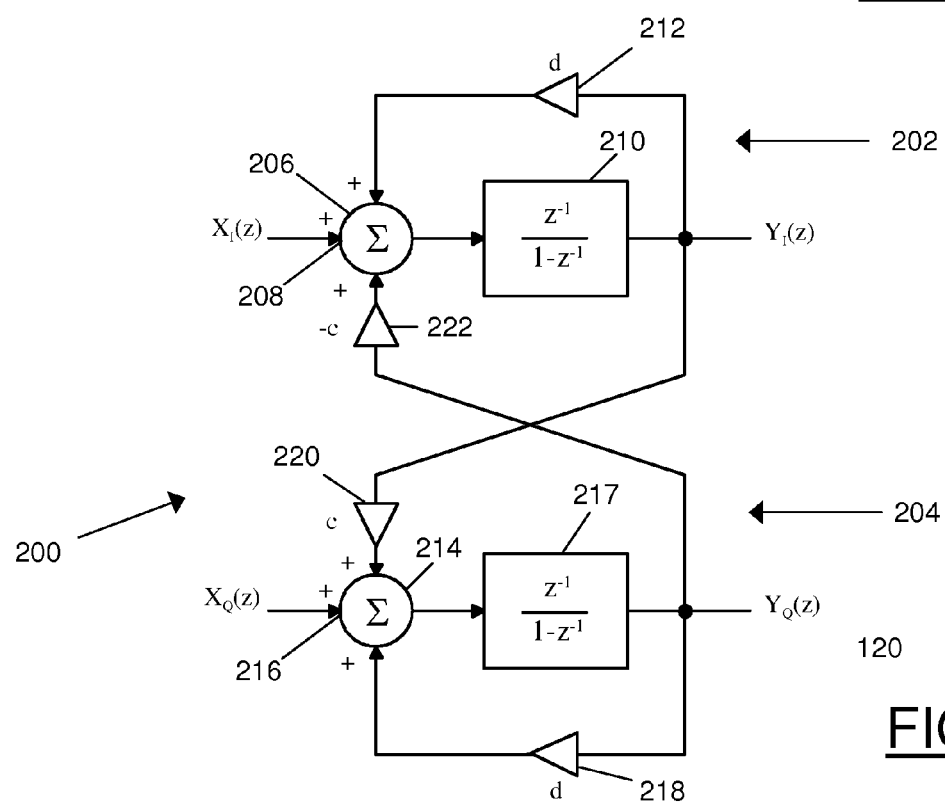
FIG. 2 is a block diagram of a first-order complex integrator constituting an embodiment of the invention.

Turning to FIG. 2, a so-called first order complex integrator 200 constitutes a building block of the complex ADC 112. A number of complex integrators are coupled in series depending upon a desired Signal-to-Noise Ratio (SNR) to be achieved by the complex ADC 112.

The complex integrator 200 comprises a first real integrator 202 cross-coupled to a second real integrator 204. The first real integrator 202 comprises a first summation unit 206 having a first integrator input 208, an output of the first summation unit 206 being coupled to an input of a first analogue filter 210 having the following transfer function:

$$\frac{z^{-1}}{1-z^{-1}}$$

An output of the first analogue filter 210 is coupled, via a first gain element 212, to the first summation unit 206.

The second real integrator 204 comprises a second summation unit 214 having a second integrator input 216, an output of the second summation unit 214 being coupled to an input of a second analogue filter 217 having the following transfer function:

$$\frac{z^{-1}}{1-z^{-1}}$$

An output of the second analogue filter 217 is coupled, via a second gain element 218, to the second summation unit 214.

In order to achieve cross-coupling of the first and second integrators 202, 204, the output of the first analogue filter 210 is also coupled to the second summation unit 214 via a third gain element 220. As part of the cross-coupling, the output of the second analogue filter 217 is also coupled to the first summation unit 206 via a fourth gain element 222. In contrast with the third gain element 220, the fourth gain element 222 provides a negative gain.

Figure 3:
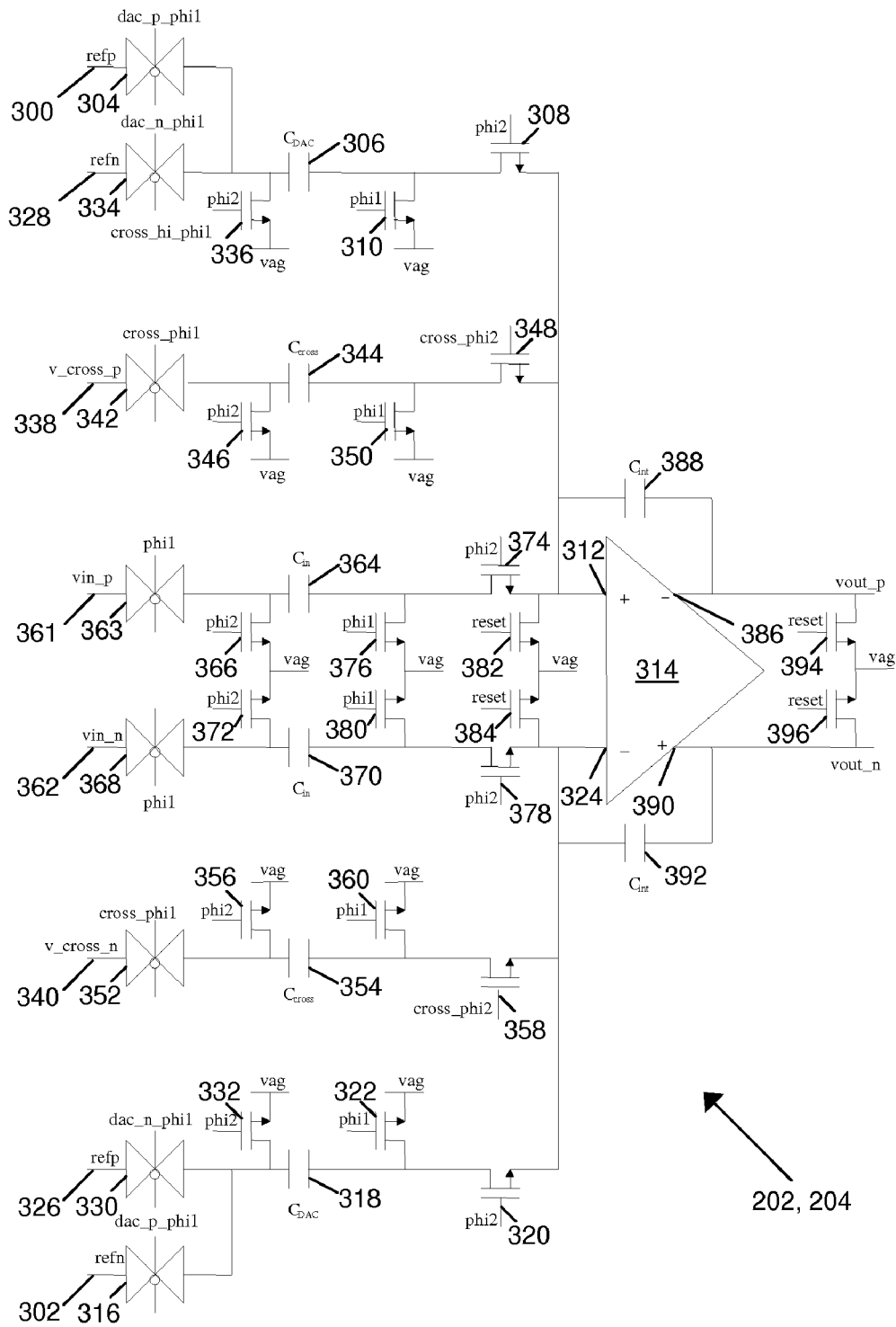
FIG. 3 is a schematic diagram of a part of the integrator of FIG. 2.

In this example, the first and second integrators 202, 204 are each implemented as a switched-capacitor circuit and, prior to feedback coupling, are structured as follows. Referring to FIG. 3, a first differential reference input of each integrator comprises a first positive reference input 300 and a first negative reference input 302. The first positive reference input 300 is coupled to a first transmission gate 304, i.e. a P-channel Metal Oxide Semiconductor (PMOS) Field Effect Transistor (FET) coupled in parallel with an N-channel Metal Oxide Semiconductor (NMOS) FET (not shown), the first transmission gate 304 being coupled to a first terminal of a first DAC capacitor 306. A second terminal of the first DAC capacitor 306 is coupled to respective drain terminals of a first NMOS FET 308 and a second NMOS FET 310, a source terminal of the first NMOS FET 308 being coupled to a non-inverting input 312 of an operational amplifier 314 and a source terminal of the second NMOS FET 310 being coupled to a common mode potential. The first negative reference input 302 is coupled to a second transmission gate 316, the second transmission gate 316 being coupled to a first terminal of a second DAC capacitor 318. A second terminal of the second DAC capacitor 318 is coupled to respective drain terminals of a third NMOS FET 320 and a fourth NMOS FET 322, a source terminal of the third NMOS FET 320 being coupled to an inverting input 324 of the operational amplifier 314 and a source terminal of the fourth NMOS FET 322 being coupled to the common mode potential.

A second differential reference input of each integrator comprises a second positive reference input 326 and a second negative reference input 328. The second positive reference input 326 is coupled to a third transmission gate 330, the third transmission gate 330 being coupled to the first terminal of the second DAC capacitor 318 and to a drain terminal of a fifth NMOS FET 332. A source terminal of the fifth NMOS FET 332 is coupled to the common mode potential. Similarly, the second negative reference input 328 is coupled to a fourth transmission gate 334, the fourth transmission gate 334 being coupled to the first terminal of the first DAC capacitor 306 and to a drain terminal of a sixth NMOS FET 336. A source terminal of the sixth NMOS FET 336 is coupled to the common mode potential.

A differential cross-over input comprises a positive cross-over input 338 and a negative cross-over input 340. The positive cross-over input 338 is coupled to a fifth transmission gate 342, the fifth transmission gate 342 being coupled to a first terminal of a first cross-over capacitor 344 and a drain terminal of a seventh NMOS FET 346. A second terminal of the first cross-over capacitor 344 is coupled to drain terminals of an eighth NMOS FET 348 and a ninth NMOS FET 350, a source terminal of the eighth NMOS FET 348 being coupled to the non-inverting input 312 of the operational amplifier 314 and source terminals of the seventh and ninth NMOS FETs 346, 350 being coupled to the common mode potential. The negative cross-over input 340 is coupled to a sixth transmission gate 352, the sixth transmission gate 352 being coupled to a first terminal of a second cross-over capacitor 354 and a drain terminal of a tenth NMOS FET 356. A second terminal of the second cross-over capacitor 354 is coupled to drain terminals of an eleventh NMOS FET 358 and a twelfth NMOS FET 360, a source terminal of the eleventh NMOS FET 358 being coupled to the inverting input 324 of the operational amplifier 314 and source terminals of the tenth and twelfth NMOS FETs 356, 360 being coupled to the common mode potential.

A differential signal input comprises a positive signal input 361 and a negative signal input 362. The positive signal input 361 is coupled to a seventh transmission gate 363, the seventh transmission gate 363 being coupled to a first terminal of a first input capacitor 364 and a drain terminal of a thirteenth NMOS FET 366. The negative signal input 362 is coupled to an eighth transmission gate 368, the eighth transmission gate 368 being coupled to a first terminal of a second input capacitor 370 and a drain terminal of a fourteenth NMOS FET 372. A source terminal of the fourteenth NMOS FET 372 is coupled to a source terminal of the thirteenth NMOS FET 366 and the common mode potential.

A second terminal of the first input capacitor 364 is coupled to a drain terminal of a fifteenth NMOS FET 374 and a drain terminal of a sixteenth NMOS FET 376. Likewise, a second terminal of the second input capacitor 370 is coupled to a drain terminal of a seventeenth NMOS FET 378 and a drain terminal of an eighteenth NMOS FET 380. A source terminal of the eighteenth NMOS FET 380 is coupled to a source terminal of the sixteenth NMOS FET 376 and the common mode potential.

A source terminal of the fifteenth NMOS FET 374 is coupled to the non-inverting input 312 of the operational amplifier 314 and a drain terminal of a nineteenth NMOS FET 382. Likewise, a source terminal of the seventeenth NMOS FET 378 is coupled to the inverting input 324 of the operational amplifier 314 and a drain terminal of a twentieth NMOS FET 384. A source terminal of the twentieth NMOS FET 384 is coupled to a source terminal of the nineteenth NMOS FET 382 and the common mode potential.

The operational amplifier 314 comprises a differential output having a negative output 386 coupled to the non-inverting input 312 via a first integrating capacitor 388, and a positive output 390 coupled to the inverting input 324 via a second integrating capacitor 392. The negative output 386 is also coupled to a drain terminal of a twenty-first NMOS FET 394 and the positive output 390 is also coupled to a drain terminal of a twenty-second NMOS FET 396. A source terminal of the twenty-first NMOS FET 394 is coupled to a source terminal of the twenty-second NMOS FET 396 and the common mode potential.

Gate terminals of the second, fourth, ninth, twelfth, sixteenth and eighteenth NMOS FETs 310, 322, 350, 360, 376, 380 are coupled to a first clock signal generator (not shown) for generating a first clock signal $\Phi_1$. Gate terminals of the first, third, fifth, sixth, seventh, tenth, thirteenth, fourteenth, fifteenth and seventeenth NMOS FETs 308, 320, 332, 336, 346, 356, 366, 372, 374, 378 are coupled to a second clock signal generator (not shown) for generating a second clock signal $\Phi_2$. Gate terminals of the fifth and sixth transmission gates 342, 352 are coupled to a third clock signal generator (not shown) for generating a third clock signal, $\Phi_{1cross}$, which is the same as the first clock signal, $\Phi_1$, while the complex ADC 112 is in a first state; the third clock signal, $\Phi_{1cross}$ is turned off, i.e. at a ground potential, when the complex ADC 112 is desired to operate in a second state. Gate terminals of the eighth and eleventh NMOS FETs 348, 358 are coupled to a fourth clock signal generator (not shown) for generating a fourth clock signal, $\Phi_{2cross}$, which is the same as the second clock signal, $\Phi_2$, while the complex ADC 112 is in the first state; the fourth clock signal, $\Phi_{2clock}$, is also turned off, i.e. at the ground potential, when the complex ADC 112 is desired to operate in the second state. Gate terminals of the nineteenth, twentieth, twenty-first and twenty-second NMOS FETs 382, 384, 394, 396 are coupled to a reset signal generator (not shown).

Referring back to FIG. 2, the third gain element 220 is provided by coupling an integrator output, for example the output of the first analogue filter 210 to a differential cross-over path of the second integrator 204; the fourth gain element 222 is provided by coupling the output of the second analogue filter 217 to the cross-over path of the first integrator 202. As the first and second integrators 202, 204 share a common structure, the differential cross-over path (FIG. 3) comprises the positive cross-over input 338, the negative cross-over input 340, the fifth and sixth transmission gates 342, 352, the first and second cross-over capacitors 344, 354, and the seventh, eighth, ninth, tenth, eleventh and twelfth NMOS FETs 346, 348, 350, 356, 358, 360. Signal inversion is achieved by simply swapping connections of the positive and negative cross-over inputs 338, 340, thereby achieving the negative gain provided by the fourth gain element 222.

In operation, and referring again to FIG. 2, the first order complex integrator 200 is in the first state, for example, when the transceiver is in a receiving mode during a first period of time. When in the first state the third and fourth gain elements 220, 222 are set such that the first and second (real) integrators 202, 204 cooperate so as to provide an integrating function with a complex pole, i.e. a non-conjugate pole in the complex domain, and the first, second, third and fourth clock signals, $\Phi_1$, $\Phi_2$, $\Phi_{1cross}$, $\Phi_{2cross}$ are used in a known manner to support implementation of the first-order complex integrator 200 and so operation in the first state will not be described in further detail herein.

However, during a second, subsequent, period of time, the first order complex integrator 200 is in a second state, for example when the transceiver is not in the receiving mode, and so RF signals are not being processed by the receiver chain 100. The complex integrator 200 is therefore not employed by the receiver chain 100 during the second period of time. In this respect, whilst the complex ADC 112 is not, in the present example, of use for other applications, other parts of the transceiver employ non-complex ADCs in a non-continuous manner. For example, a control loop for a control circuit of a power amplifier (not shown) of the transceiver, Digital-to-Analogue Converter (DAC) testing, i.e. testing the transmitter DACs of the transceiver during product testing phase, and/or monitoring of supply battery voltage in a communications device, such as a cellular telephone handset. Hence, when coupled, the first and second integrators 202, 204 serve a first signal processing function and, when electrically decoupled, the first integrator 202 serves a second signal processing function and/or the second integrator 204 serves a third signal processing function.

Consequently, the third and fourth gain elements 220, 222 are manipulated so as to decouple the first integrator 202 from the second integrator 204, thereby inhibiting the cross-coupling achieved by the coupling of the output of the first analogue filter 210 to the second summation unit 214 and the output of the second analogue filter 217 to the first summation unit 206. The first and second integrators 202, 204 therefore become independently operable.

In the context of the integrator structure of FIG. 3, a number of techniques exist to manipulate the third and fourth gain elements 220, 222 provided by the cross-over paths mentioned above and hence, effectively, decouple the first integrator 202 from the second integrator 204. Two of such techniques to manipulate the third and/or fourth gain elements 220, 222 are now described below.

In a first decoupling technique, flow of electrical current through the respective differential cross-over paths of the first and second integrators 202, 204 is respectively prevented by selective activation of the fifth and sixth transmission gates 342, 352 of each of the first and second integrators 202, 204, thereby preventing current from flowing from the positive cross-over input 338 and the negative cross-over input 340 to the operational amplifier 314. Selective activation of the fifth and sixth transmission gates 342, 352 is achieved by disabling the third clock signal, $\Phi_{1clock}$, using, for example, any suitable switched capacitor circuit.

In a second decoupling technique, flow of electrical current through the respective differential cross-over paths of the first and second integrators 202, 204 is respectively prevented by selective activation of the eighth and eleventh NMOS FETs 348, 358 of each of the first and second integrators 202, 204, thereby preventing current from flowing from the positive cross-over input 338 and the negative cross-over input 340 to the operational amplifier 314. Selective activation of the eighth and eleventh NMOS FETs 348, 358 is achieved by disabling the fourth clock signal, $\Phi_{2clock}$, using, for example, any suitable switched capacitor circuit.

Of course, the skilled person will appreciate that the above-described first and second decoupling techniques can be employed in combination.

Figure 4:
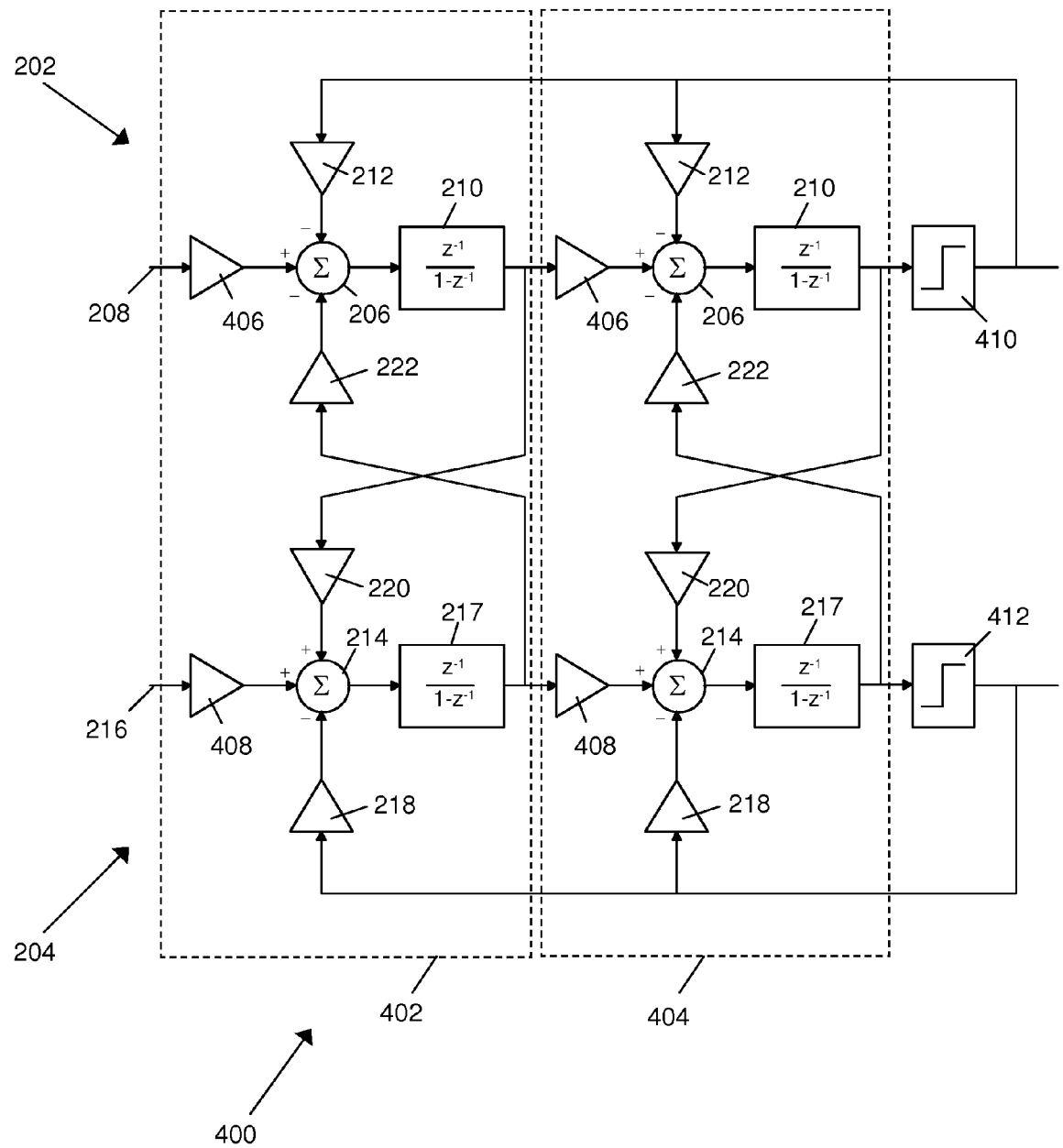
FIG. 4 is a block diagram of a second-order complex sigma-delta modulator constituting another embodiment of the invention, the second-order complex sigma-delta modulator being in a first state.

In another embodiment (FIG. 4), a second-order complex sigma-delta modulator 400 comprises a first first-order complex integrator 402 serially coupled to a second first-order complex integrator 404 to form a cascaded topology. However, in this example, each of the first and second first-order complex integrators 402, 404 comprises a fifth gain element 406 and a sixth gain element 408. In this respect, the first real integrator input 208 is coupled to the first summation unit 206 of the first first-order complex integrator 402 via the fifth gain element 406 of the first first-order complex integrator 402. Likewise, the second real integrator input 216 is coupled to the second summation unit 214 of the first first-order complex integrator 402 via the sixth gain element 408 of the first first-order complex integrator 402.

In order to couple the first first-order complex integrator 402 to the second first-order complex integrator 404, the output of the first analogue filter 210 of the first first-order complex integrator 402 is coupled to the fifth gain element 406 of the second first-order complex integrator 404, the fifth gain element 406 of the second first-order complex integrator 404 being coupled to the first summation unit 206 of the second first-order complex integrator 404. Similarly, the output of the second analogue filter 217 of the first first-order complex integrator 402 is coupled to the sixth gain element 408 of the second first-order complex integrator 404, the sixth gain element 408 of the second first-order complex integrator 404, being coupled to the second summation unit 214 of the second first-order complex integrator 404.

The output of the first analogue filter 210 of the second first-order complex integrator 404 is coupled to a first comparator 410, the output of the first comparator 410 being coupled to the first summation units 206 of the first and second first-order complex integrators 402, 404 via the first gain elements 212 of the first and second first-order complex integrators 402, 404, respectively. Likewise, the output of the second analogue filter 217 of the second first-order complex integrator 404 is coupled to a second comparator 412, the output of the second comparator 412 being coupled to the second summation units 214 of the first and second first-order complex integrators 402, 404 via the second gain elements 218 of the first and second first-order complex integrators 402, 404, respectively. The first gain elements 212 of the first and second first-order complex integrators 402, 404 can have different gain values. Likewise, the second gain elements 218 of the first and second first-order complex integrator 402, 404 can have different gain values.

In operation, the second-order complex sigma-delta modulator 400 has a first state, for example, when the transceiver is in a receiving mode during a first period of time. When in the first state, the third and fourth gain elements 220, 222 of the first and second first-order complex integrators 402, 404 are set such that the (real) integrators forming a second-order complex integrator cooperate so as to provide an integrating function with non-conjugate complex poles and a higher SNR than the first-order complex integrator 200 of FIG. 2. The first, second, third and fourth clock signals, $\Phi_1$, $\Phi_2$, $\Phi_{1cross}$, $\Phi_{2cross}$, are used in a known manner to support implementation of the first-order complex integrator 200 and so operation in the first state will not be described further herein.

During a second, subsequent period of time, the second-order complex sigma-delta modulator 400 is in a second state, for example when the transceiver is not in the receiving mode, and so RF signals are not being processed by the receiver chain 100. The second-order complex sigma-delta modulator 400 is therefore not employed by the receiver chain 100 during the second period of time. In this respect, whilst an ADC comprising the second-order complex sigma-delta modulator 400 is not, in the present example, of use for other applications, other parts of the transceiver require non-complex ADC functionality in a non-continuous manner. For example, as mentioned above, the control loop for the control circuit of the power amplifier of the transceiver, DAC testing, i.e. testing the transmitter DACs of the transceiver during product testing, and/or monitoring of supply battery voltage in a communications device, such as a cellular telephone handset. Hence, when coupled, the first and second integrators 202, 204 serve a first signal processing function and, when electrically decoupled, the first integrator 202 serves a second signal processing function and/or the second integrator 204 serves a third signal processing function.

Consequently, in the same way as described above in relation to the first-order complex integrator 200, the third and fourth gain elements 220, 222 of the first and second first-order complex integrators 402, 404 of the second-order complex sigma-delta modulator 400 are manipulated so as to decouple the first integrators 202 from the second integrators 204 of the second-order complex sigma-delta modulator 400. The cross-coupling achieved by the coupling of the outputs of the first analogue filters 210 of the first and second first-order complex integrators 402, 404 to the second summation units 214 of the first and second first-order complex integrators 402, 404 and the outputs of the second analogue filters 217 of the first and second first-order complex integrators 402, 404 to the first summation units 206 of the first and second first-order complex integrators 402, 404 is therefore inhibited.

Figure 5:
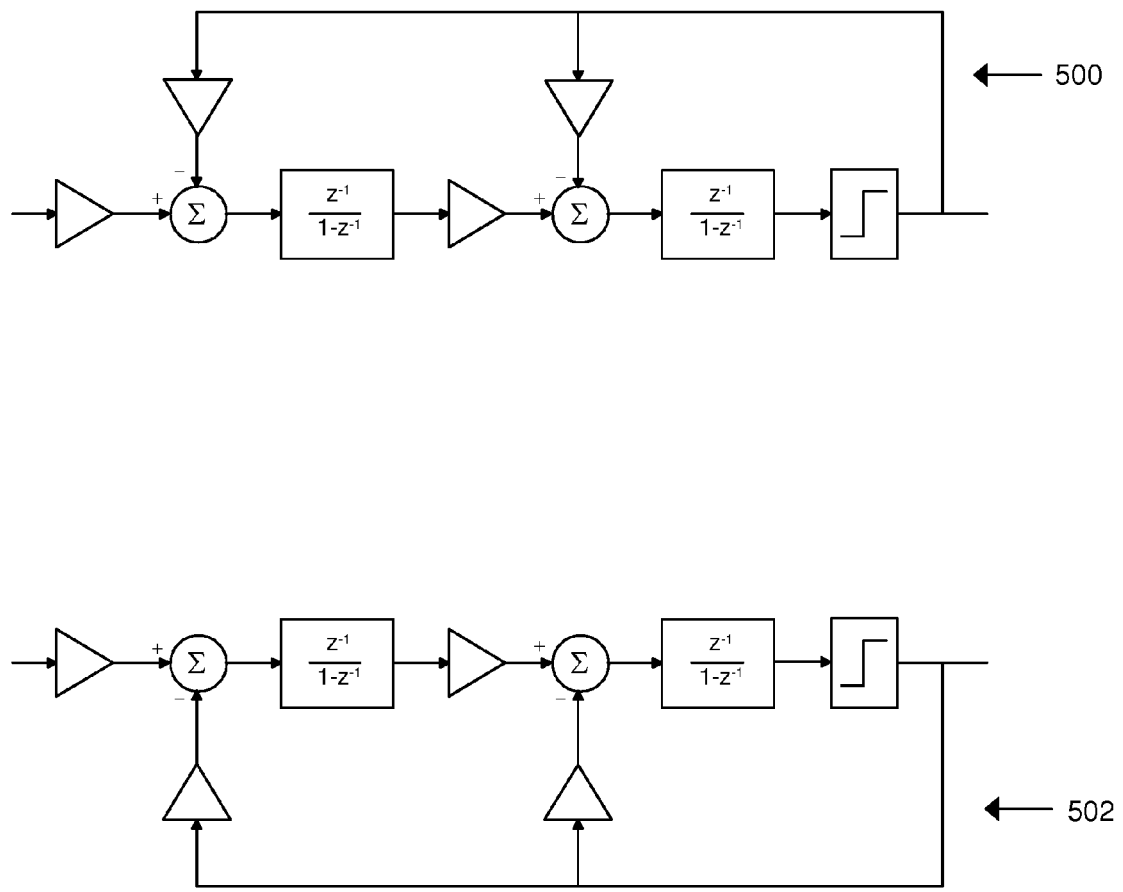
FIG. 5 is a block diagram of the second-order complex sigma-delta modulator of FIG. 4 in a second state.

A pair of second-order (real) sigma-delta ADC modulators 500, 502 (FIG. 5) therefore results for use in other circuits in the transceiver.

Although the above examples have been described in the context of a transceiver, the skilled person will appreciate that the principles of the above examples can be employed in relation to other circuits, where it is desirable to employ real integrator components of a complex integrator whilst complex integration is not required.

References herein to NMOS FETs should be understood to be for exemplary purposes only and other suitable voltage variable elements, for example other threshold-dependent conduction devices, such as other switching devices, can be employed in other applications where compatible to do so.

It is thus possible to provide an apparatus and method capable of reusing an analogue-to-digital converter comprising complex integrators, so that dedicated integrators, and hence dedicated analogue-to-digital converters, do not have to be provided for certain applications that do not need to use the integrators whilst the complex integrator is in use. Consequently, die space can be saved. Of course, the above advantages are exemplary, and these or other advantages may be achieved by the invention. Further, the skilled person will appreciate that not all advantages stated above are necessarily achieved by embodiments described herein.

The invention claimed is:

1. An analogue-to-digital converter apparatus comprising:
a first integrator;
a second integrator, the first integrator coupled to a second integrator so as to provide a complex pole, the first integrator being selectively electrically decouplable from the second integrator so as to remove the complex pole.

2. An apparatus as claimed in claim 1, wherein the complex pole is a non-conjugate pole.

3. An apparatus as claimed in claim 1, wherein the first integrator is coupled to the second integrator during a first period of time and the first integrator is electrically decoupled from the second integrator during a second period of time subsequent to the first period of time.

4. An apparatus as claimed in claim 1, wherein the first integrator is cross-coupled with the second integrator.

5. An apparatus as claimed in claim 1, wherein the first integrator is independently operable from the second integrator when the first integrator is electrically decoupled from the second integrator.

6. An apparatus as claimed in claim 1, wherein when coupled together, the first and second integrators serve a first signal processing application and, when electrically decoupled, the first integrator serves a second signal processing application.

7. An apparatus as claimed in claim 1, wherein the first integrator is coupled to the second integrator by a first cross-over circuit path.

8. An apparatus as claimed in claim 7, wherein the first cross-over circuit path comprises a first switched-capacitor cross-over circuit.

9. An apparatus as claimed in claim 7, wherein the first integrator is coupled to the second integrator by a second cross-over circuit path.

10. An apparatus as claimed in claim 9, wherein the second cross-over circuit path comprises a second switched-capacitor cross-over circuit.

11. An apparatus as claimed in claim 7, wherein the first cross-over circuit path comprises a first cross-over capacitor.

12. An apparatus as claimed in claim 9, wherein the second cross-over circuit path comprises a second cross-over capacitor.

13. An apparatus as claimed in claim 11, wherein the first cross-over capacitor is coupled between a voltage variable element and an amplifier of the first integrator.

14. An apparatus as claimed in claim 11, further comprising a voltage variable element coupled between the first cross-over capacitor, and an amplifier of the first integrator.

15. An apparatus as claimed in claim 13, wherein the voltage variable element is controllable so that the first integrator is selectively electrically decouplable from the second integrator.

16. A modulator comprising the analogue-to-digital converter apparatus as claimed in claim 1.

17. A Sigma-Delta modulator comprising the analogue-to-digital converter apparatus as claimed in claim 1.

18. A communications apparatus comprising the analogue-to-digital converter apparatus as claimed in claim 1.

19. A method of reusing an analogue-to-digital converter circuit comprising:

selectively electrically decoupling a first integrator from a second integrator so as to remove a complex pole that exists, when in use, when the first integrator is electrically coupled to the second integrator.

20. An apparatus as claimed in claim 3, wherein the first integrator is cross-coupled with the second integrator.

* * * * *